United States Patent
Endoh

(10) Patent No.: US 10,298,181 B2
(45) Date of Patent: May 21, 2019

(54) LOW-NOISE AMPLIFICATION DEVICE, METHOD, AND ATTENUATION ADJUSTMENT PROGRAM

(71) Applicant: NEC Corporation, Minato-ku, Tokyo (JP)

(72) Inventor: Kunio Endoh, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 15/578,803

(22) PCT Filed: Jun. 9, 2016

(86) PCT No.: PCT/JP2016/002798
§ 371 (c)(1),
(2) Date: Dec. 1, 2017

(87) PCT Pub. No.: WO2016/203742
PCT Pub. Date: Dec. 22, 2016

(65) Prior Publication Data
US 2018/0159481 A1 Jun. 7, 2018

(30) Foreign Application Priority Data
Jun. 15, 2015 (JP) .................... 2015-120195

(51) Int. Cl.
*H03F 1/26* (2006.01)
*H03F 1/52* (2006.01)
(Continued)

(52) U.S. Cl.
CPC ................ *H03F 1/26* (2013.01); *H03F 1/52* (2013.01); *H03F 3/189* (2013.01); *H03G 3/30* (2013.01);
(Continued)

(58) Field of Classification Search
None
See application file for complete search history.

(56) References Cited

U.S. PATENT DOCUMENTS

| 5,687,195 A | 11/1997 | Hwang et al. |
| 6,014,553 A * | 1/2000 | Kim ............... H03G 3/3036 330/278 |

(Continued)

FOREIGN PATENT DOCUMENTS

| EP | 3272029 B1 | 10/2018 |
| JP | H04-351005 A | 12/1992 |

(Continued)

OTHER PUBLICATIONS

International Search Report for PCT Application No. PCT/JP2016/002798, dated Aug. 30, 2016.

(Continued)

*Primary Examiner* — Fayyaz Alam

(57) ABSTRACT

Strength of a signal received by a low-noise amplifier is controlled depending on strength of a reception signal emitted to a communication satellite by a mobile terminal. A low-noise amplification device provided in the communication satellite comprises: a variable-power attenuation unit which generates an attenuation signal by attenuating the reception signal received in the communication satellite; a low-noise amplification unit which generates an amplification signal by amplifying the attenuation signal with low noise; and a signal control unit which outputs a control signal to the variable-power attenuation unit depending on the attenuation signal, and then adjusts an attenuation of the variable-power attenuation unit.

12 Claims, 10 Drawing Sheets

(51) Int. Cl.
*H03G 3/30* (2006.01)
*H04B 1/16* (2006.01)
*H04B 1/18* (2006.01)
*H03F 3/189* (2006.01)
*H04B 7/185* (2006.01)

(52) U.S. Cl.
CPC ............... *H04B 1/16* (2013.01); *H04B 1/18* (2013.01); *H04B 7/18515* (2013.01); *H04B 7/18534* (2013.01)

(56) References Cited

U.S. PATENT DOCUMENTS

| | | | | |
|---|---|---|---|---|
| 7,706,744 | B2* | 4/2010 | Rodgers | H04B 7/2606 455/11.1 |
| 2007/0184790 | A1* | 8/2007 | Gilberton | H03F 1/0205 455/127.1 |
| 2009/0124227 | A1* | 5/2009 | Ishiguro | H04B 1/18 455/249.1 |
| 2013/0033316 | A1* | 2/2013 | Sasho | H03G 1/0088 330/144 |
| 2015/0055733 | A1* | 2/2015 | Asano | H04B 1/525 375/297 |
| 2016/0014705 | A1 | 1/2016 | Tani et al. | |
| 2016/0274240 | A1 | 9/2016 | Wheatley | |

FOREIGN PATENT DOCUMENTS

| | | |
|---|---|---|
| JP | H10-215123 A | 8/1998 |
| JP | 2008-054260 A | 3/2008 |
| JP | 2008-312028 A | 12/2008 |
| JP | 2011-205700 A | 10/2011 |
| JP | 2013-038509 A | 2/2013 |
| WO | 2014/129038 A1 | 8/2014 |

OTHER PUBLICATIONS

English translation of Written opinion for PCT Application No. PCT/JP2016/002798.
Japanese Office Action for JP Application No. 2017-524596 dated Jan. 15, 2019 with English Translation.
Extended European Search Report for EP Application No. EP16811217.5 dated Jan. 21, 2019.

* cited by examiner

US 10,298,181 B2

LOW-NOISE AMPLIFICATION DEVICE, METHOD, AND ATTENUATION ADJUSTMENT PROGRAM

This application is a National Stage Entry of PCT/JP2016/002798 filed on Jun. 9, 2016, which claims priority from Japanese Patent Application 2015-120195 filed on Jun. 15, 2015, the contents of all of which are incorporated herein by reference, in their entirety.

TECHNICAL FIELD

The present invention relates to a low-noise amplification device and method, and an attenuation adjustment program.

BACKGROUND ART

In recent years, a satellite communication service in which communication between general mobile terminals is performed via a communication satellite has been under study. The communication satellite typically comprises, at a front end, a low-noise amplifier for amplifying, with low noise, a signal emitted by the mobile terminal. The low-noise amplifier is known to deteriorate in performance when receiving a signal of excessive strength. When the strength of the signal received by the low-noise amplifier is excessive, it is necessary to reduce the signal before the low-noise amplifier receives the signal.

In the satellite communication service in particular, strength of a signal received by the low-noise amplifier changes depending on the number of mobile terminals that emit signals to the communication satellite. Therefore, there is a need to control, depending on strength of a reception signal received by the communication satellite, the signal received by the low-noise amplifier.

PTL 1 discloses a receiving high-frequency circuit comprising a protection circuit of a low-noise amplifier, capable of determining that the low-noise amplifier receives an excessive signal, and protecting the low-noise amplifier from the excessive signal. According to the technique described in PTL 1, the low-noise amplifier is operated by two electrodes of a positive electrode and a negative electrode, and when a signal that is determined to have excessive strength is received, one of the electrodes is cut off, whereby the signal received by the low-noise amplifier is reduced.

PTL 2 discloses an excessive input protection circuit capable of easily following a change in strength of a reception signal, and preventing breakage of a low-noise amplifier. The technique described in PTL 2 comprises an excessive input determining circuit for determining the strength of the signal, so that when a signal of excessive input is received, a flow path of the signal is switched, whereby the low-noise amplifier is protected.

CITATION LIST

Patent Literature

[PTL 1] Japanese Laid-open Patent Publication No. 2008-54260
[PTL 2] Japanese Laid-open Patent Publication No. 2008-312028

SUMMARY OF INVENTION

Technical Problem

Therefore, a problem in PTL 1 and PTL 2 is that a signal received by the low-noise amplifier is only cut off by switching a flow path of the signal, and control of the signal received by the low-noise amplifier is not considered at all.

An object of the present invention is to provide a low-noise amplification device and method, and an attenuation adjustment program which control strength of a reception signal received by a low-noise amplifier, depending on strength of a reception signal received by the communication satellite.

Solution to Problem

A low-noise amplification device according to one aspect of the present invention is a low-noise amplification device provided in a communication satellite, and comprises: a variable-power attenuation unit which generates an attenuation signal by attenuating a reception signal received in the communication satellite; a low-noise amplification unit which generates an amplification signal by amplifying the attenuation signal with low noise; and a signal control unit which outputs a control signal to the variable-power attenuation unit depending on the attenuation signal, and then adjusts an attenuation of the variable-power attenuation unit.

A low-noise amplification device according to another aspect of the present invention is a low-noise amplification device provided in a communication satellite, and comprises: a variable-power attenuation unit which generates an attenuation signal by attenuating a reception signal received in the communication satellite; a signal control unit which outputs a control signal to the variable-power attenuation unit depending on the reception signal, and then adjusts an attenuation of the variable-power attenuation unit; and a low-noise amplification unit which generates an amplification signal by amplifying the attenuation signal with low noise.

A low-noise amplification device according to yet another aspect of the present invention is a low-noise amplification device provided in a communication satellite, and comprises: a variable-power attenuation unit which generates an attenuation signal by attenuating a reception signal received in the communication satellite; a low-noise amplification unit which generates an amplification signal by amplifying the attenuation signal with low noise; a digital channelizer which generates a feeder link signal by receiving the amplification signal; and a signal control unit which outputs a control signal to the variable-power attenuation unit depending on a use status of a frequency band of the feeder link signal, and then adjusts an attenuation of the variable-power attenuation unit.

A low-noise amplification method according to yet another aspect of the present invention is a low-noise amplification method executed in a communication satellite, and comprises: generating an attenuation signal by attenuating, in a variable-power attenuation unit, a reception signal received in the communication satellite; generating an amplification signal by amplifying the attenuation signal with low noise in a low-noise amplification unit; and outputting a control signal to the variable-power attenuation unit depending on the attenuation signal, and then adjusting an attenuation of the variable-power attenuation unit, in a signal control unit.

An attenuation adjustment program according to yet another aspect of the present invention is an attenuation adjustment program which causes a computer to adjust an attenuation of a variable-power attenuation unit for use in a low-noise amplification device provided in a communication satellite. The low-noise amplification device comprises: the variable-power attenuation unit which generates an attenuation signal by attenuating a reception signal received in the communication satellite; and a low-noise amplification unit which generates an amplification signal by amplifying the attenuation signal with low noise. The attenuation adjustment program causes the computer to perform processing of outputting a control signal to the variable-power attenuation unit depending on the attenuation signal, and then adjusting an attenuation of the variable-power attenuation unit.

Advantageous Effects of Invention

According to the present invention, it is possible to control strength of a reception signal received by a low-noise amplifier depending on strength of a reception signal received by the communication satellite.

DESCRIPTION OF EMBODIMENTS

First Example Embodiment

A low-noise amplification device 10 according to a first example embodiment of the present invention will be described with reference to FIG. 1.

Figure 1:
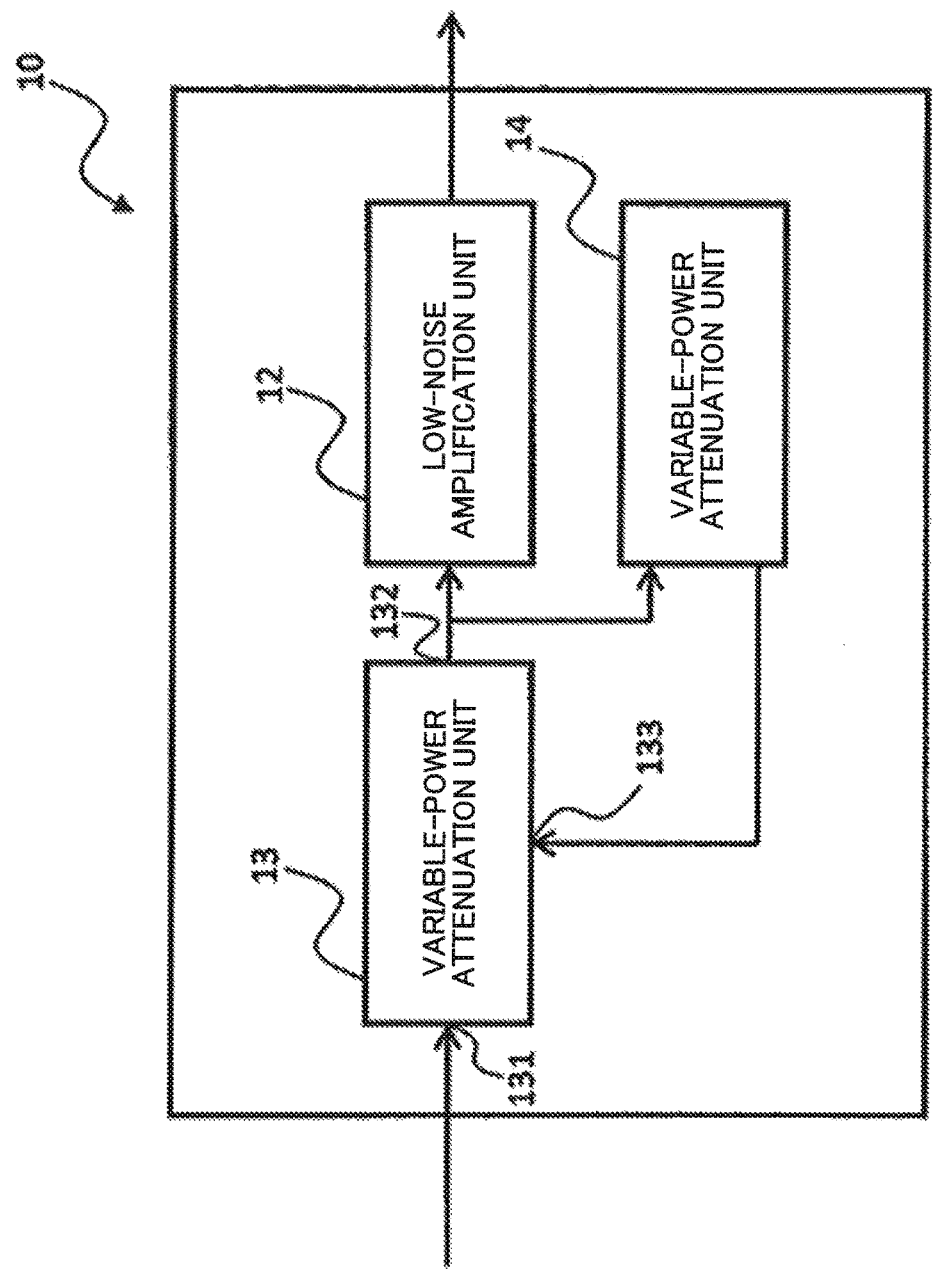
FIG. 1 is a block diagram illustrating a configuration of a low-noise amplification device according to a first example embodiment of the present invention.

FIG. 1 is a block diagram illustrating a configuration of the low-noise amplification device 10 according to the first example embodiment of the present invention.

The illustrated low-noise amplification device 10 is a device which is mounted at a front end of a receiving circuit (not illustrated) in a communication satellite and can thereby amplify, with low noise, a signal to be received.

The low-noise amplification device 10 comprises a low-noise amplification unit 12, a variable-power attenuation unit 13, and a signal control unit 14.

The low-noise amplification unit 12 generates an amplification signal by amplifying a received signal with low noise. Further, the low-noise amplification unit 12 outputs the amplification signal to a non-illustrated receiving circuit. Herein, the low-noise amplification unit 12 may be obtained by use of a general low-noise amplifier. Note that the low-noise amplification unit 12 is known to deteriorate in performance when receiving a signal of excessive strength. Thus, when the low-noise amplification unit 12 receives a signal of excessive strength, it is necessary to reduce the strength of the signal before the low-noise amplification unit 12 receives the signal.

The variable-power attenuation unit 13 has an adjustable attenuation as will be described later, and attenuates strength of a reception signal received by the communication satellite from a mobile terminal (not illustrated), and thereby generates an attenuation signal. Further, the variable-power attenuation unit 13 outputs the generated attenuation signal to the low-noise amplification unit 12. That is, the low-noise amplification unit 12 generates an amplification signal from the attenuation signal generated by the variable-power attenuation unit 13. As a result, the variable-power attenuation unit 13 attenuates a signal of excessive strength, so that deterioration in performance of the low-noise amplification unit 12 can be prevented.

Note that the attenuation set in the variable-power attenuation unit 13 is a minimum (i.e., 0) at an initial stage. In other words, when the communication satellite does not receive any reception signal of excessive strength, the variable-power attenuation unit 13 does not particularly reduce strength of a reception signal, and outputs the reception signal to the low-noise amplification unit 12 as the attenuation signal without change. In addition, the variable-power attenuation unit 13 can adjust the attenuation in accordance with a control signal which will be described later. Moreover, the variable-power attenuation unit 13 may be obtained by, for example, an analog circuit using a PIN diode, and a digital circuit comprising a variable resistor.

The signal control unit 14 monitors strength of the attenuation signal received by the low-noise amplification unit 12. At least one threshold of the strength of the attenuation signal is previously determined for the signal control unit 14. The signal control unit 14 compares the threshold with a strength signal indicating the strength of the attenuation signal received by the low-noise amplification unit 12, and generates a control signal which is an instruction to adjust the attenuation of the signal of the variable-power attenuation unit 13 on the basis of the comparison result. Further, the signal control unit 14 outputs the generated control signal to the variable-power attenuation unit 13. Thus, the variable-power attenuation unit 13 has three terminals of an input terminal 131 which receives a reception signal, an output terminal 132 which outputs an attenuation signal, and a control terminal 133 which receives a control signal.

Figure 2:
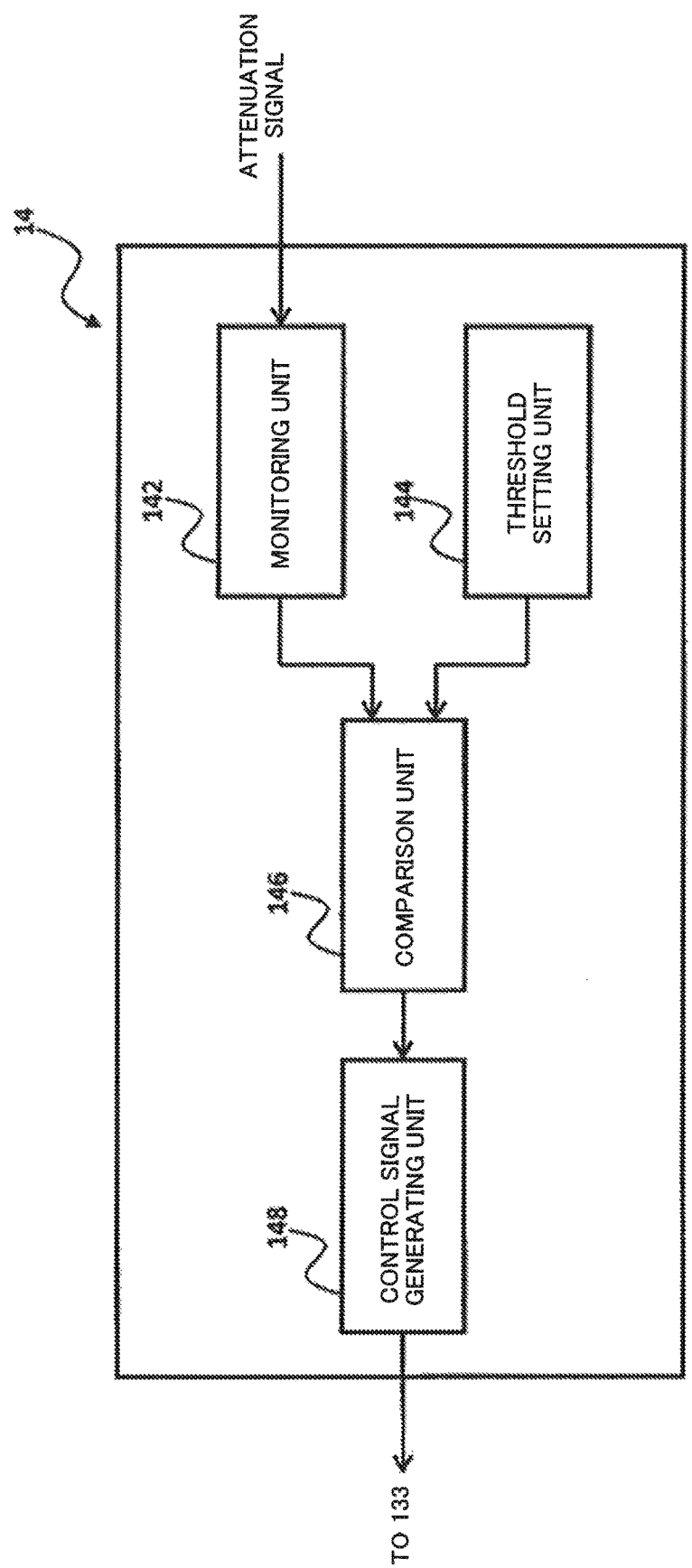
FIG. 2 is a block diagram illustrating one example of a configuration of a signal control unit used in the low-noise amplification device illustrated in FIG. 1.

FIG. 2 is a block diagram illustrating one example of a configuration of the signal control unit 14. The signal control unit 14 comprises a monitoring unit 142 which generates a strength signal by monitoring strength of the attenuation signal, a threshold setting unit 144 which sets and outputs a threshold of the strength signal generated from the attenuation signal, a comparison unit 146 which outputs a comparison result by comparing the strength signal with the threshold, and a control signal generating unit 148 which generates a control signal on the basis of the comparison result.

Herein, in the illustrated example, a "threshold" set in the threshold setting unit 144 is set at a maximum allowable value of strength of an attenuation signal that can be received in the low-noise amplification unit 12. When a strength signal that represents the strength of the attenuation signal is lower than the threshold, the comparison unit 146 outputs a low-level signal as a comparison result (comparison signal). On the other hand, when the strength signal that represents the strength of the attenuation signal is higher than the threshold, the comparison unit 146 outputs a high-level signal as a comparison result (comparison signal). When the comparison signal is at a low level, the control signal generating unit 148 generates a control signal such that attenuation of the variable-power attenuation unit 13 may be smaller than the current one. However, the minimum value of the attenuation of the variable-power attenuation unit 13 is 0, so that the attenuation of the variable-power attenuation unit 13 does not decrease to less than 0. On the other hand, when the comparison signal is at a high level, the control signal generating unit 148 generates a control signal such that the attenuation of the variable-power attenuation unit 13 may be greater than the current one.

Note that the signal control unit 14 illustrated in FIG. 2 comprises the comparison unit 146, but may comprise a subtraction unit instead of the comparison unit 146. In this case, the subtraction unit subtracts the threshold from the strength signal that represents the strength of the attenuation signal, and then outputs a difference signal that represents the difference. When the difference signal has a negative value, the control signal generating unit 148 generates a control signal such that the attenuation of the variable-power attenuation unit 13 may be smaller than the current one. In this instance, depending on an absolute value of the difference signal, the control signal generating unit 148 may generate a control signal so that a change range of the attenuation of the variable-power attenuation unit 13 may be variable. However, as described above, the attenuation of the variable-power attenuation unit 13 does not decrease to less than 0. On the other hand, when the difference signal has a positive value, the control signal generating unit 148 generates a control signal such that the attenuation of the variable-power attenuation unit 13 may be greater than the current one. In this instance as well, depending on an absolute value of the difference signal, the control signal generating unit 148 may generate a control signal so that a change range of the attenuation of the variable-power attenuation unit 13 may be variable.

In other words, the low-noise amplification device 10 can automatically adjust the attenuation of the variable-power attenuation unit 13 depending on strength of a reception signal received by the communication satellite. Therefore, even when the communication satellite receives a plurality of reception signals from mobile terminals and strength of a reception signal which is a collection of the plurality of reception signals is excessive, the communication satellite can inhibit input of the excessive signal to the low-noise amplification unit 12 by increasing the attenuation of the variable-power attenuation unit 13. As a result, in a satellite communication service, communication between mobile terminals can be performed via the communication satellite without deterioration in performance of the low-noise amplification unit 12.

[Operation of Low-Noise Amplification Device 10]

Figure 3:
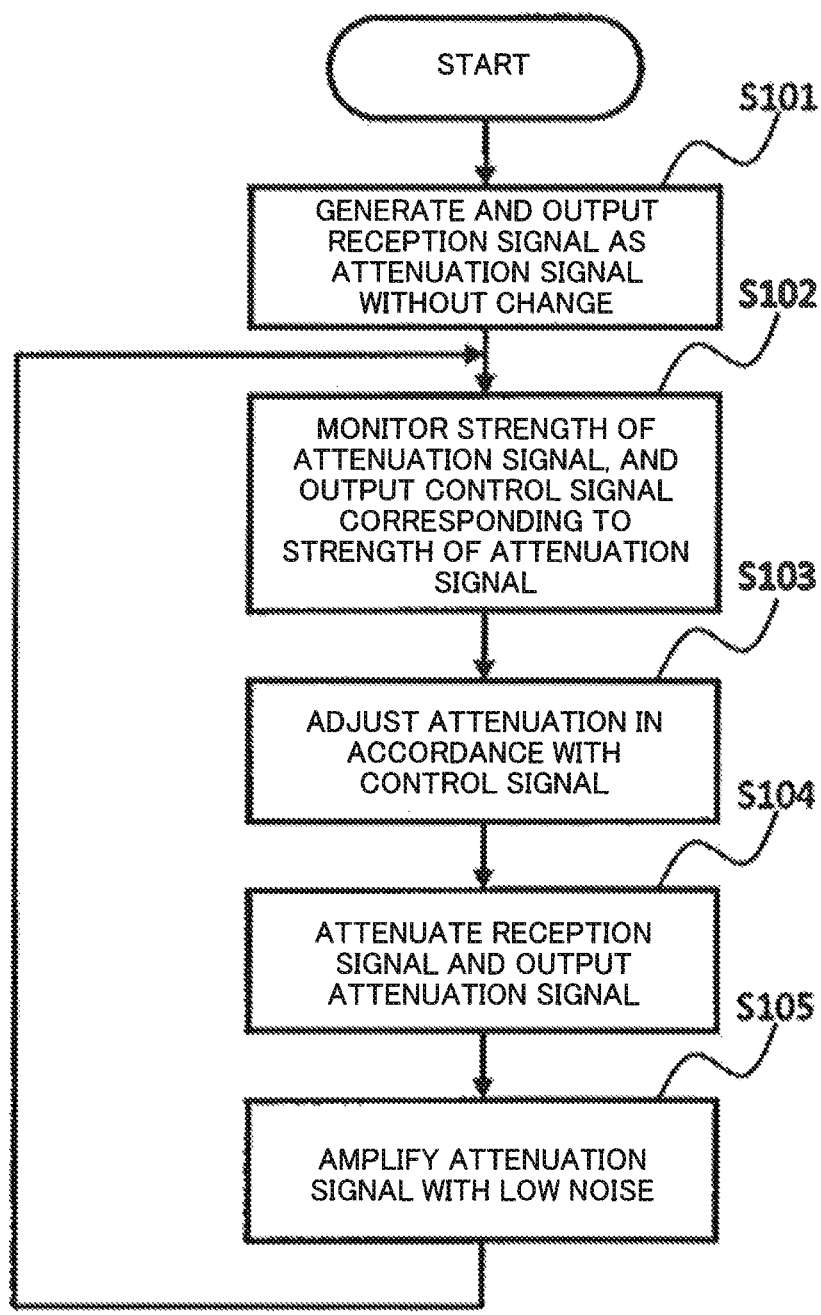
FIG. 3 is a flowchart illustrating an operation of the low-noise amplification device according to the first example embodiment of the present invention.

FIG. 3 is a flowchart illustrating an operation of the low-noise amplification device 10. The operation of the low-noise amplification device 10 will be described below with reference to FIG. 3.

First, at an initial stage, the variable-power attenuation unit 13 receives a reception signal at the input terminal 131 and generates an attenuation signal in accordance with an attenuation of 0 set by a control signal which will be described later, and outputs the attenuation signal to the low-noise amplification unit 12 and the signal control unit 14 from the output terminal 132 (step S101). In other words, at the initial stage, the variable-power attenuation unit 13 generates the reception signal as the attenuation signal without change, and outputs the attenuation signal.

Then, the signal control unit 14 monitors strength of the attenuation signal, generates a control signal corresponding to the strength of the attenuation signal, and outputs the control signal to the variable-power attenuation unit 13 (step S102).

To be specific, the monitoring unit 142 generates a strength signal that represents the strength of the attenuation signal by monitoring the strength of the attenuation signal output from the output terminal 132 of the variable-power attenuation unit 13. The threshold setting unit 144 sets and outputs a threshold of the strength signal. The comparison unit 146 outputs a comparison result by comparing the strength signal with the threshold. The control signal generating unit 148 generates a control signal on the basis of the comparison result, and outputs the control signal to the control terminal 133 of the variable-power attenuation unit 13.

Then the variable-power attenuation unit 13 adjusts the attenuation in accordance with the control signal received from the signal control unit 14 (step S103).

The variable-power attenuation unit 13 generates an attenuation signal by attenuating the reception signal in accordance with the adjusted attenuation, and outputs the attenuation signal to the low-noise amplification unit 12 and the signal control unit 14 from the output terminal 132 (step S104).

Furthermore, the low-noise amplification unit 12 receives the attenuation signal output from the variable-power attenuation unit 13, thereby amplifies the attenuation signal with low noise, and generates an amplification signal (step S105).

The low-noise amplification device 10 repeats the operations in steps S102 to S105 described above.

In this way, the low-noise amplification device 10 according to the present first example embodiment automatically adjusts the attenuation of the variable-power attenuation unit 13 by feedback control, thereby preventing any excessive signal (attenuation signal) from being supplied to the low-noise amplification unit 12.

Second Example Embodiment

Figure 4:
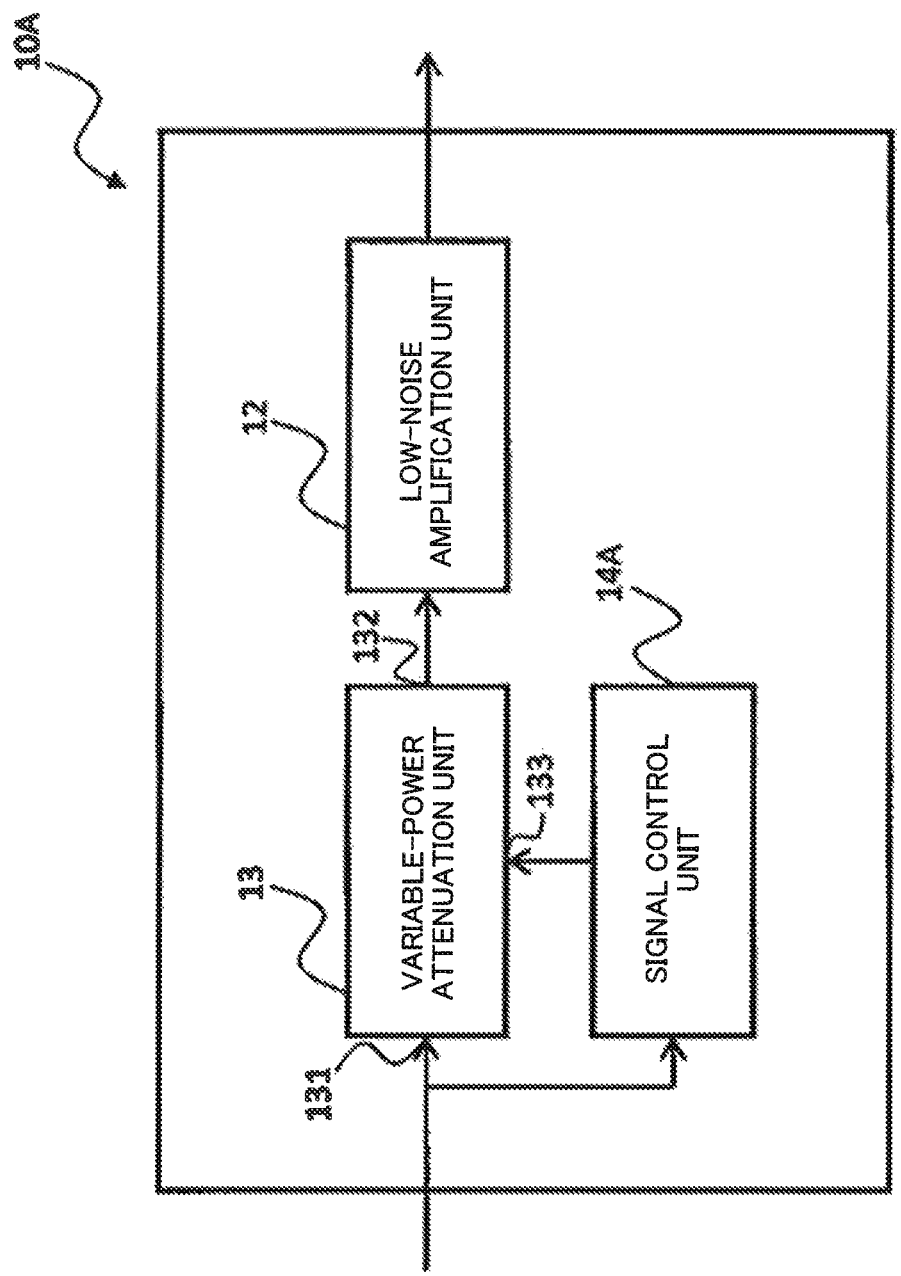
FIG. 4 is a block diagram illustrating a configuration of a low-noise amplification device according to a second example embodiment of the present invention.

FIG. 4 is a block diagram illustrating a configuration of a low-noise amplification device 10A according to a second example embodiment of the present invention. The low-noise amplification device 10A will be described below with reference to FIG. 4.

The low-noise amplification device 10A is different from the low-noise amplification device 10 which generates a control signal depending on an attenuation signal, and the low-noise amplification device 10A generates a control signal depending on a reception signal received by a communication satellite.

The low-noise amplification device 10A comprises a low-noise amplification unit 12, a variable-power attenuation unit 13, and a signal control unit 14A. Note that the low-noise amplification unit 12 and the variable-power attenuation unit 13 are similar to those in the first example embodiment, and therefore description thereof is omitted.

The signal control unit 14A monitors strength of a reception signal received by the variable-power attenuation unit 13 at an input terminal 131 thereof. At least one threshold of the strength of the reception signal is previously determined for the signal control unit 14A. The signal control unit 14A obtains a difference between the threshold and a strength signal indicating the strength of the reception signal received by the variable-power attenuation unit 13, and generates a control signal which is an instruction to adjust attenuation of a signal of the variable-power attenuation unit 13 on the basis of a degree of the difference. Further, the signal control unit 14A outputs the generated control signal to a control terminal 133 of the variable-power attenuation unit 13.

Figure 5:
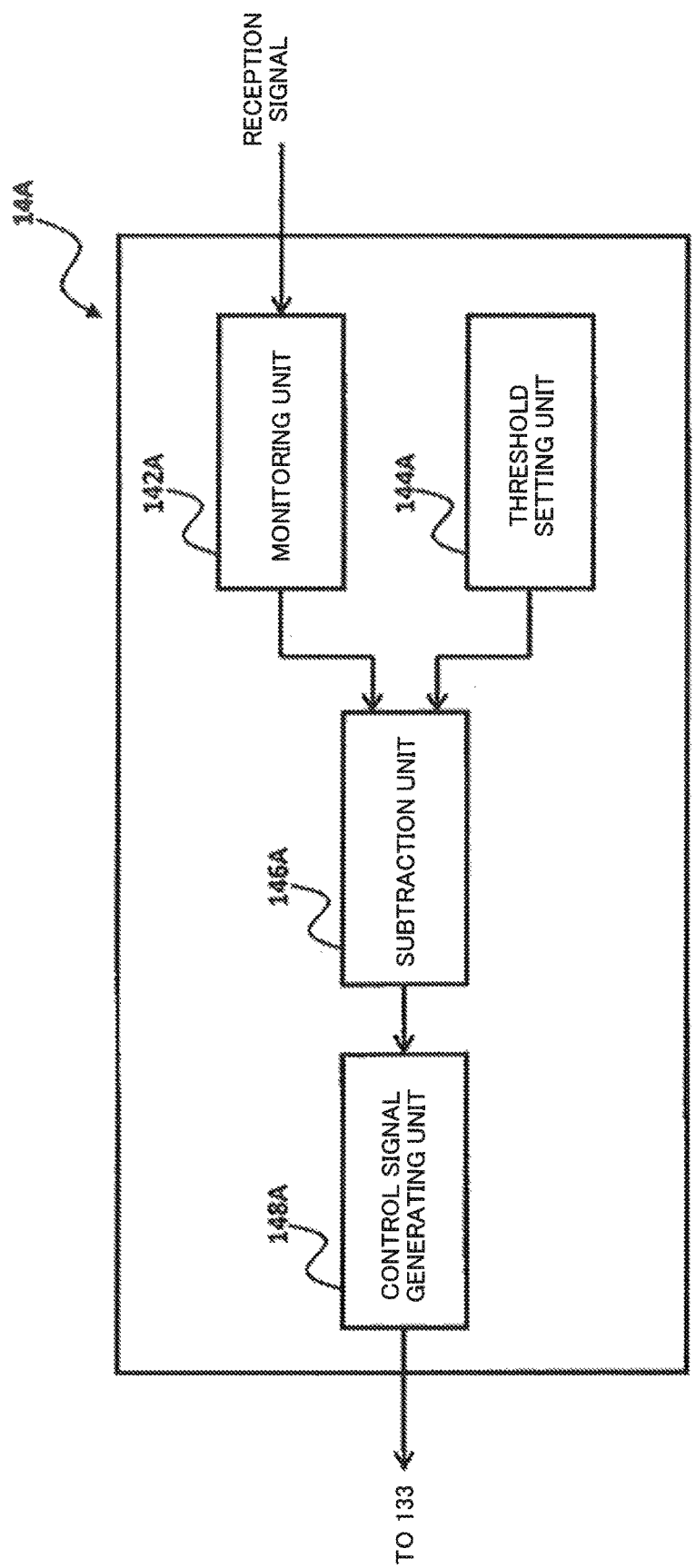
FIG. 5 is a block diagram illustrating one example of a configuration of a signal control unit used in the low-noise amplification device illustrated in FIG. 4.

FIG. 5 is a block diagram illustrating one example of a configuration of the signal control unit 14A. The signal control unit 14A comprises a monitoring unit 142A which generates a strength signal that represents the strength of the reception signal by monitoring the strength of the reception signal, a threshold setting unit 144A which sets and outputs a threshold of the strength signal generated from the reception signal, a subtraction unit 146A which calculates a difference between the strength signal and the threshold and then outputs a difference signal that represents the difference, and a control signal generating unit 148A which generates a control signal on the basis of the difference signal.

Herein, in the illustrated example as well, a "threshold" set in the threshold setting unit 144A is set at a maximum allowable value of strength of an attenuation signal that can be received in the low-noise amplification unit 12. The subtraction unit 146A subtracts the threshold from the strength signal of the reception signal, and then outputs a difference signal that represents the difference. When the difference signal has a negative value, the control signal generating unit 148A generates a control signal such that the attenuation of the variable-power attenuation unit 13 may be 0. In other words, when the strength signal is lower than the threshold, the control signal generating unit 148A does not change the attenuation of the variable-power attenuation unit 13. On the other hand, when the difference signal has a positive value, the control signal generating unit 148A generates a control signal such that the attenuation of the variable-power attenuation unit 13 may increase by a variable range corresponding to an absolute value of the difference signal.

Therefore, the control signal generating unit 148A may previously store, in a memory (e.g., a read only memory (ROM)), a table or a function that represents a relation between the difference signal and the control signal defining the attenuation of the variable-power attenuation unit 13, and obtain the control signal by accessing the ROM by using the difference signal as an address.

In other words, the low-noise amplification device 10A can automatically adjust the attenuation of the variable-power attenuation unit 13 depending on the strength of the reception signal received by the communication satellite. Therefore, even when the communication satellite receives a plurality of reception signals from mobile terminals and strength of a reception signal which is a collection of the plurality of reception signals is excessive, the communication satellite can inhibit input of the excessive signal to the low-noise amplification unit 12 by increasing the attenuation of the variable-power attenuation unit 13. As a result, in a satellite communication service, communication between mobile terminals can be performed via the communication satellite without deterioration in performance of the low-noise amplification unit 12.

[Operation of Low-Noise Amplification Device 10A]

Figure 6:
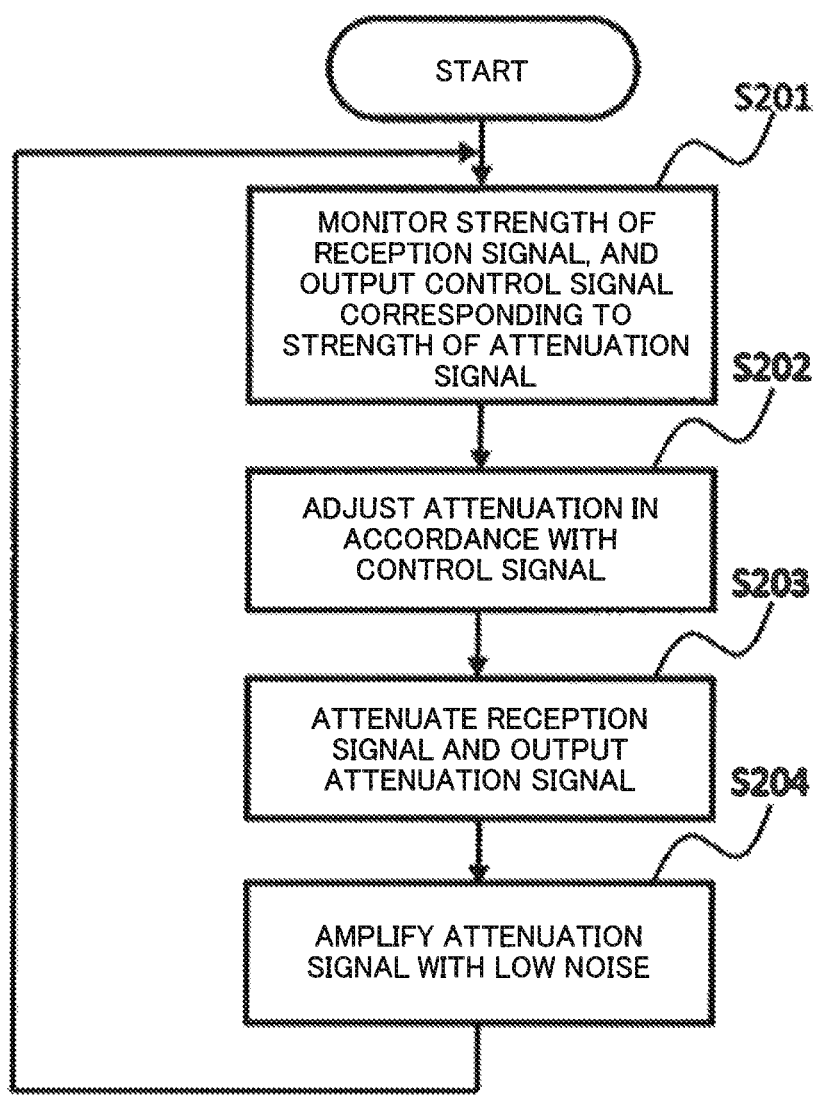
FIG. 6 is a flowchart illustrating an operation of the low-noise amplification device according to the second example embodiment of the present invention.

FIG. 6 is a flowchart illustrating an operation of the low-noise amplification device 10A. The operation of the low-noise amplification device 10A will be described below with reference to FIG. 6.

First, the signal control unit 14A monitors strength of a reception signal received by the communication satellite, generates a control signal corresponding to the strength of the reception signal, and outputs the control signal to the variable-power attenuation unit 13 (step S201).

To be specific, the monitoring unit 142A generates a strength signal that represents the strength of the reception signal by monitoring the strength of the reception signal received by the communication satellite. The threshold setting unit 144A sets and outputs a threshold of the strength signal. The subtraction unit 146A outputs a difference signal by obtaining a difference between the strength signal and the threshold. The control signal generating unit 148A generates a control signal on the basis of the difference signal, and outputs the control signal to the control terminal 133 of the variable-power attenuation unit 13.

Then the variable-power attenuation unit 13 adjusts the attenuation in accordance with the control signal received from the signal control unit 14A (step S202).

The variable-power attenuation unit 13 generates an attenuation signal by attenuating the reception signal received at the input terminal 131 in accordance with the adjusted attenuation, and outputs the attenuation signal to the low-noise amplification unit 12 from the output terminal 132 (step S203).

Furthermore, the low-noise amplification unit 12 receives the attenuation signal output from the variable-power attenuation unit 13, thereby amplifies the attenuation signal with low noise, and generates an amplification signal (step S204).

The low-noise amplification device 10A repeats the operations in steps S201 to S204 described above.

In this way, the low-noise amplification device 10A according to the present second example embodiment automatically adjusts the attenuation of the variable-power attenuation unit 13 by feedforward control, thereby preventing any excessive signal (attenuation signal) from being supplied to the low-noise amplification unit 12.

Third Example Embodiment

A low-noise amplification device 10B according to a third example embodiment of the present invention will be described below in detail.

Figure 7:
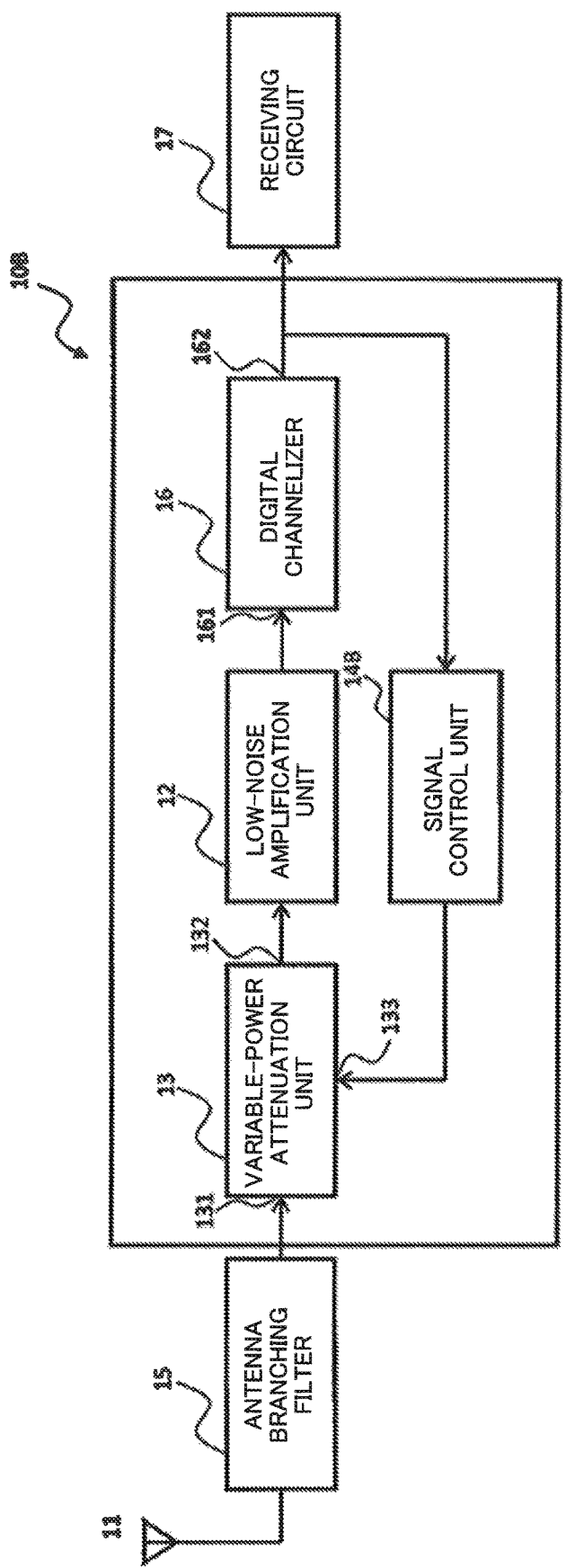
FIG. 7 is a block diagram illustrating a configuration of a low-noise amplification device according to a third example embodiment of the present invention.

FIG. 7 is a block diagram illustrating a configuration of a receiving system of a communication satellite comprising the low-noise amplification device 10B according to the third example embodiment of the present invention.

The receiving system of the communication satellite illustrated in FIG. 7 comprises the low-noise amplification device 10B, an antenna 11, an antenna branching filter 15, and a receiving circuit 17. The low-noise amplification device 10B comprises a low-noise amplification unit 12, a variable-power attenuation unit 13, a signal control unit 14B, and a digital channelizer 16.

The antenna 11 receives, as a reception signal, a transmission signal emitted by a mobile terminal (not illustrated), and outputs the reception signal received from the mobile terminal, to the low-noise amplification device 10B via the antenna branching filter 15. The antenna branching filter 15 switches between a reception flow path for the antenna 11 to receive the reception signal and a transmission flow path to emit the transmission signal.

In the low-noise amplification device 10B, the low-noise amplification unit 12 generates an amplification signal by amplifying, with low noise, an attenuation signal received via the antenna branching filter 15 and the variable-power attenuation unit 13. Further, the low-noise amplification unit 12 outputs the amplification signal to the digital channelizer 16. Note that specific functions of the low-noise amplification device 10B will be described later.

The digital channelizer 16 generates a feeder link signal by receiving the amplification signal.

Herein, a general method in the case where communication between mobile terminals is performed via the communication satellite is described. When the communication between mobile terminals is performed via the communication satellite, one feeder link signal is typically generated from a plurality of signals emitted by the mobile terminals. Then, the communication satellite downlinks the generated feeder link signal to a control station on the ground. Herein, a communication path that connects the communication satellite to the control station is referred to as a feeder link.

Figure 8:
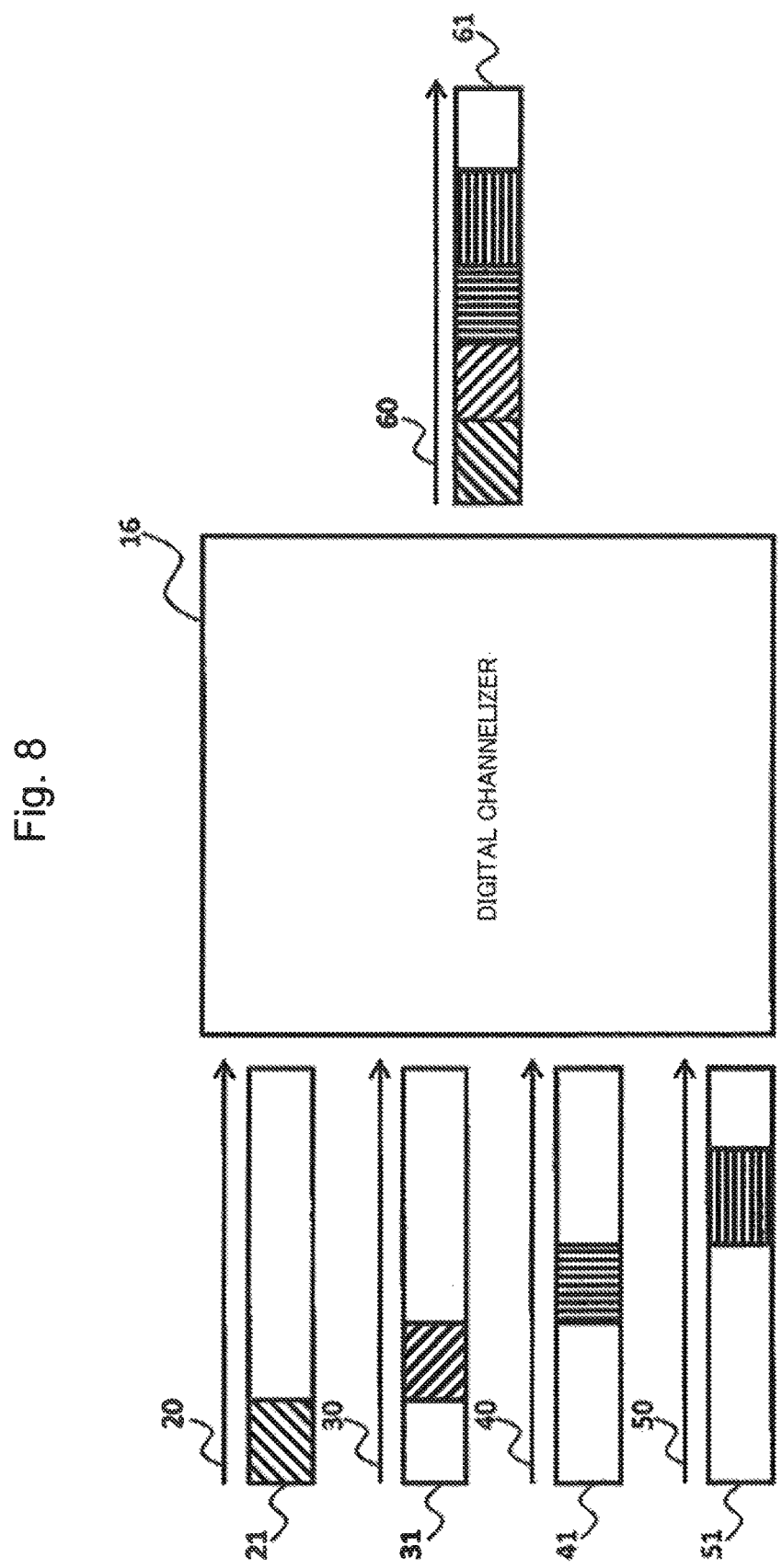
FIG. 8 is a conceptual diagram for explaining a feeder link signal.

An operation of the digital channelizer 16 will be described below with reference to FIG. 8. FIG. 8 is a conceptual diagram illustrating the operation of the digital channelizer 16.

Referring to FIG. 8, the digital channelizer 16 receives, for example, a first signal 20 emitted by a user A, a second signal 30 emitted by a user B, a third signal 40 emitted by a user C, and a fourth signal 50 emitted by a user D.

FIG. 8 illustrates, with hatching, a first frequency band 21 as a use status of the first signal 20, a second frequency band 31 as a use status of the second signal 30, a third frequency band 41 as a use status of the third signal 40, and a fourth frequency band 51 as a use status of the fourth signal 50.

The digital channelizer 16 receives the first signal 20, the second signal 30, the third signal 40, and the fourth signal 50, thereby generating a feeder link signal 60 and outputting the feeder link signal 60. A use status of the feeder link signal 60 is illustrated as a fifth frequency band 61. Herein, the fifth frequency band 61 which is the use status of the feeder link signal 60 is the sum of the use statuses of the first frequency band 21, the second frequency band 31, the third frequency band 41, and the fourth frequency band 51. Although described later, the low-noise amplification device 10B can control attenuation of strength of a signal of the variable-power attenuation unit 13 on the basis of the fifth frequency band 61 which is the use status of the feeder link signal 60 output by the digital channelizer 16.

In other words, the digital channelizer 16 can receive amplification signals emitted by a plurality of low-noise amplification devices 10B provided in the communication satellite, thereby generating one feeder link signal and outputting the feeder link signal to the receiving circuit 17.

Herein, the low-noise amplification device 10B is specifically described. Note that the low-noise amplification unit 12 and the variable-power attenuation unit 13 are similar to those in the first example embodiment and the second example embodiment, and therefore description thereof is omitted.

The signal control unit 14B monitors a use status of a frequency band of the feeder link signal output from the digital channelizer 16. At least one threshold of the use status of the frequency band of the feeder link signal is previously determined for the signal control unit 14B. The signal control unit 14B compares the threshold with a use status signal indicating the use status of the frequency band of the feeder link signal, and generates a control signal which is an instruction to adjust the attenuation of the signal of the variable-power attenuation unit 13 on the basis of the comparison result. Further, the signal control unit 14B outputs the generated control signal to the variable-power attenuation unit 13.

Figure 9:
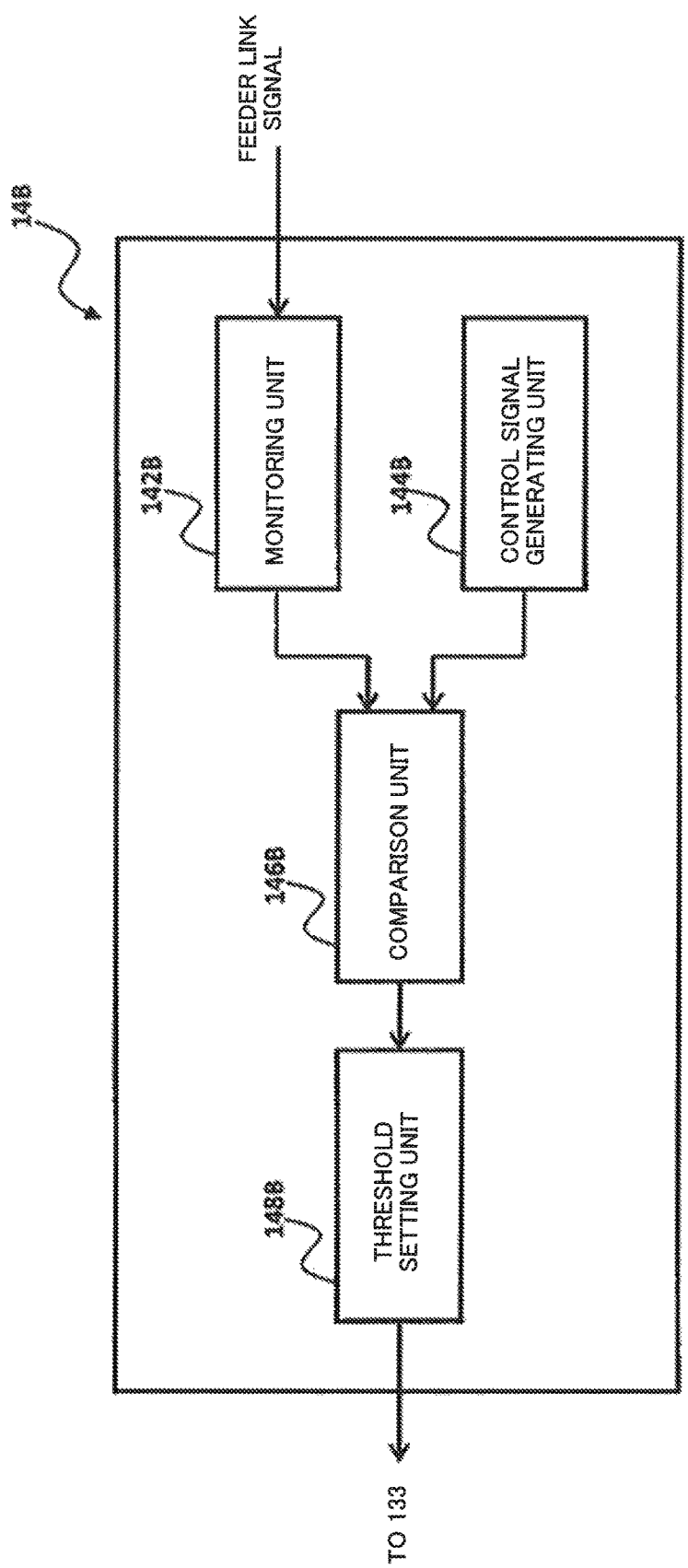
FIG. 9 is a block diagram illustrating one example of a configuration of a signal control unit used in the low-noise amplification device illustrated in FIG. 7.

FIG. 9 is a block diagram illustrating one example of a configuration of the control signal unit 14B. The signal control unit 14B comprises a monitoring unit 142B which monitors a use status of a frequency band of the feeder link signal and then generates a use status signal indicating the use status, a threshold setting unit 144B which sets and outputs a threshold of the use status of the frequency band of the feeder link signal, a comparison unit 146B which outputs a comparison result by comparing the use status signal with the threshold, and a control signal generating unit 148B which generates a control signal on the basis of the comparison result.

In other words, the low-noise amplification device 10B can adjust the attenuation of the variable-power attenuation unit 13 depending on the strength (use status signal) of the reception signal received by the communication satellite. Therefore, even when the communication satellite receives a plurality of reception signals from mobile terminals and strength of a reception signal which is a collection of the plurality of reception signals is excessive, the communication satellite can inhibit input of the excessive signal to the low-noise amplification unit 12 by increasing the attenuation of the variable-power attenuation unit 13. As a result, in a satellite communication service, communication between mobile terminals can be performed via the communication satellite without deterioration in performance of the low-noise amplification unit 12.

[Operation of Low-Noise Amplification Device 10B]

Figure 10:
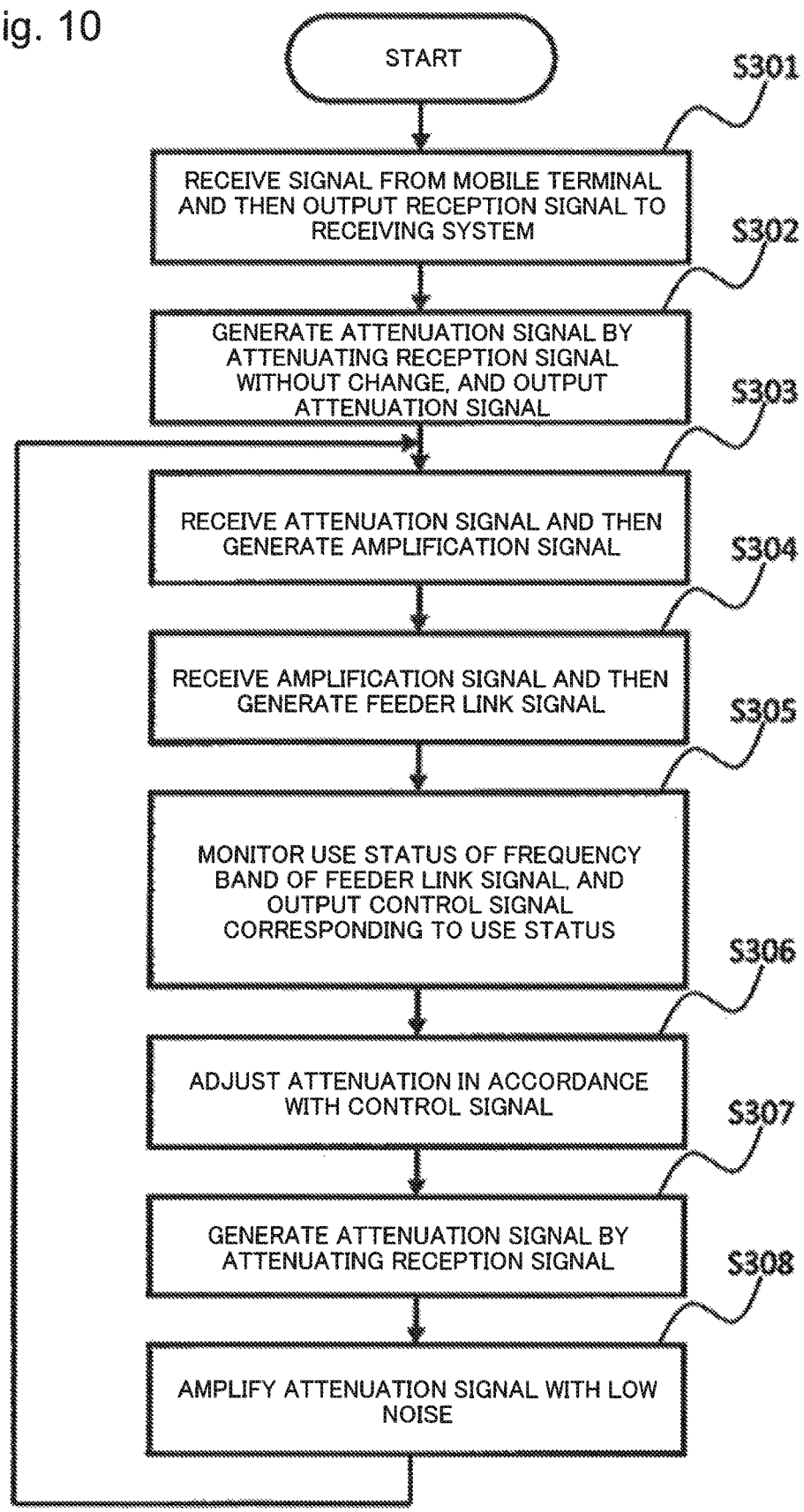
FIG. 10 is a flowchart illustrating an operation of the low-noise amplification device according to the third example embodiment of the present invention.

FIG. 10 is a flowchart illustrating an operation of the low-noise amplification device 10B according to the third example embodiment of the present invention. The operation of the low-noise amplification device 10B will be described below with reference to FIG. 10.

First, the antenna 11 receives, as a reception signal, a transmission signal emitted by a mobile terminal, and outputs the reception signal to the variable-power attenuation unit 13 via the antenna branching filter 15 (step S301).

Next, at an initial stage, the variable-power attenuation unit 13 receives a reception signal at an input terminal 131 and generates an attenuation signal in accordance with an attenuation of 0 set by a control signal which will be described later, and outputs the attenuation signal to the low-noise amplification unit 12 from an output terminal 132 (step S302). In other words, at the initial stage, the variable-power attenuation unit 13 generates the reception signal as the attenuation signal without change, and outputs the attenuation signal.

Then, the low-noise amplification unit 12 generates an amplification signal by receiving the attenuation signal from the variable-power attenuation unit 13, and outputs the amplification signal to the digital channelizer 16 (step S303).

Furthermore, the digital channelizer 16 generates a feeder link signal by receiving the amplification signal from the low-noise amplification unit 12, and outputs the feeder link signal to the receiving circuit 17 and the signal control unit 14B (step S304).

Then, the signal control unit 14B monitors a use status of a frequency band of the feeder link signal, generates a control signal corresponding to the use status of the frequency band, and outputs the control signal to the variable-power attenuation unit 13 (step S305).

To be specific, the monitoring unit 142B generates a use status signal that represents the use status of the frequency band of the feeder link signal by monitoring the use status of the frequency band of the feeder link signal. The threshold setting unit 144B sets and outputs a threshold of the use status of the frequency band of the feeder link signal. The comparison unit 146B outputs a comparison result by comparing the use status signal with the threshold. The control signal generating unit 148B generates a control signal on the basis of the comparison result, and outputs the control signal to a control terminal 133 of the variable-power attenuation unit 13.

Then, the variable-power attenuation unit 13 adjusts the attenuation in accordance with the control signal received from the signal control unit 14B (step S306).

The variable-power attenuation unit 13 generates an attenuation signal by attenuating the reception signal received at the input terminal 131 in accordance with the adjusted attenuation, and outputs the attenuation signal to the low-noise amplification unit 12 from the output terminal 132 (step S307).

Furthermore, the low-noise amplification unit 12 receives the attenuation signal output from the variable-power attenuation unit 13, thereby amplifies the attenuation signal with low noise, and generates an amplification signal (step S308).

The low-noise amplification device 10B repeats the operations in steps S303 to S308 described above.

In this way, the low-noise amplification device 10B according to the present third example embodiment automatically adjusts the attenuation of the variable-power attenuation unit 13 by feedback control, thereby preventing any excessive signal (attenuation signal) from being supplied to the low-noise amplification unit 12.

Note that the signal control unit 14, the signal control unit 14A, and the signal control unit 14B that constitute the low-noise amplification device 10, the low-noise amplification device 10A, and the low-noise amplification device 10B described above may be obtained by hardware or software. Alternatively, the signal control unit 14, the signal control unit 14A, and the signal control unit 14B may be obtained by combination of hardware and software.

For example, a central processing unit (CPU) may cause a computer to operate as the signal control unit 14, the signal control unit 14A, and the signal control unit 14B, by reading a program held by a readable storage medium. The storage medium comprises, by way of example, a magnetic disk, an optical disk, a magneto-optical disk, a semiconductor memory, and the like. Moreover, the program may be not only held by the storage medium that can be read by the CPU but also held by a storage device connected to a network.

Some or all of the example embodiments described above can also be described as in Supplementary notes below. Note that Supplementary notes below do not at all limit the present invention.

[Supplementary Note 1]

A low-noise amplification device provided in a communication satellite, comprising:

a variable-power attenuation unit which generates an attenuation signal by attenuating a reception signal received in the communication satellite;

a low-noise amplification unit which generates an amplification signal by amplifying the attenuation signal with low noise; and a signal control unit which outputs a control signal to the variable-power attenuation unit depending on the attenuation signal, and then adjusts an attenuation of the variable-power attenuation unit.

[Supplementary Note 2]

The low-noise amplification device according to Supplementary note 1, wherein at an initial stage, an attenuation of the variable-power attenuation unit is set at 0, and the variable-power attenuation unit generates the reception signal as the attenuation signal without change.

[Supplementary Note 3]

The low-noise amplification device according to Supplementary note 1 or 2, wherein the signal control unit comprises a monitoring unit which generates a strength signal by monitoring strength of the attenuation signal, a threshold setting unit which sets and outputs a threshold of the strength signal, a comparison unit which outputs a comparison result by comparing the strength signal with the threshold, and a control signal generating unit which generates the control signal, based on the comparison result.

[Supplementary Note 4]

A low-noise amplification device provided in a communication satellite, comprising:

a variable-power attenuation unit which generates an attenuation signal by attenuating a reception signal received in the communication satellite;

a signal control unit which outputs a control signal to the variable-power attenuation unit depending on the reception signal, and then adjusts an attenuation of the variable-power attenuation unit; and a low-noise amplification unit which generates an amplification signal by amplifying the attenuation signal with low noise.

[Supplementary Note 5]

The low-noise amplification device according to Supplementary note 4, wherein the signal control unit comprises a monitoring unit which generates a strength signal by monitoring strength of the reception signal, a threshold setting unit which sets and outputs a threshold of the strength signal, a subtraction unit which outputs a difference signal by obtaining a difference between the strength signal and the threshold, and a control signal generating unit which generates the control signal, based on the difference signal.

[Supplementary Note 6]

A low-noise amplification device provided in a communication satellite, comprising:

a variable-power attenuation unit which generates an attenuation signal by attenuating a reception signal received in the communication satellite;

a low-noise amplification unit which generates an amplification signal by amplifying the attenuation signal with low noise;

a digital channelizer which generates a feeder link signal by receiving the amplification signal; and a signal control unit which outputs a control signal to the variable-power attenuation unit depending on a use status of a frequency band of the feeder link signal, and then adjusts an attenuation of the variable-power attenuation unit.

[Supplementary Note 7]

The low-noise amplification device according to Supplementary note 6, wherein at an initial stage, an attenuation of the variable-power attenuation unit is set at 0, and the variable-power attenuation unit generates the reception signal as the attenuation signal without change.

[Supplementary Note 8]

The low-noise amplification device according to Supplementary note 6 or 7, wherein the signal control unit comprises a monitoring unit which generates a use status signal by monitoring a use status of a frequency band of the feeder link signal, a threshold setting unit which sets and outputs a threshold of the use status signal, a comparison unit which outputs a comparison result by comparing the use status signal with the threshold, and a control signal generating unit which generates the control signal, based on the comparison result.

[Supplementary Note 9]

A low-noise amplification method which is executed in a communication satellite, the method comprising:

generating an attenuation signal by attenuating, in a variable-power attenuation unit, a reception signal received in the communication satellite;

generating an amplification signal by amplifying the attenuation signal with low noise in a low-noise amplification unit; and outputting a control signal to the variable-power attenuation unit depending on the attenuation signal, and then adjusting an attenuation of the variable-power attenuation unit, in a signal control unit.

[Supplementary Note 10]

The low-noise amplification method according to Supplementary note 9, wherein at an initial stage, an attenuation of the variable-power attenuation unit is set at 0, and the variable-power attenuation unit generates the reception signal as the attenuation signal without change.

[Supplementary Note 11]

The low-noise amplification method according to Supplementary note 9 or 10, wherein adjusting an attenuation of the variable-power adjustment unit in the signal control unit comprises generating a strength signal by monitoring strength of the attenuation signal in an attenuation signal monitoring unit, setting and outputting a threshold of the strength signal in a threshold setting unit, outputting a comparison result by comparing the strength signal with the threshold in a comparison unit, and generating the control signal, based on the comparison result in a control signal generating unit.

[Supplementary Note 12]

A low-noise amplification method which is executed in a communication satellite, the method comprising:

generating an attenuation signal by attenuating, in a variable-power attenuation unit, a reception signal received in the communication satellite;

outputting a control signal to the variable-power attenuation unit depending on the reception signal, and then adjusting an attenuation of the variable-power attenuation unit, in a signal control unit; and generating an amplification signal by amplifying the attenuation signal with low noise in a low-noise amplification unit.

[Supplementary Note 13]

The low-noise amplification method according to Supplementary note 12, wherein adjusting an attenuation of the variable-power adjustment unit in the signal control unit comprises generating a strength signal by monitoring strength of the reception signal in a reception signal monitoring unit, setting and outputting a threshold of the strength signal in a threshold setting unit, outputting a difference signal by obtaining a difference between the strength signal and the threshold in a subtraction unit, and generating the control signal, based on the difference signal in a control signal generating unit.

[Supplementary Note 14]

A low-noise amplification method which is executed in a communication satellite, the method comprising:

generating an attenuation signal by attenuating, in a variable-power attenuation unit, a reception signal received in the communication satellite;

generating an amplification signal by amplifying the attenuation signal with low noise in a low-noise amplification unit;

generating a feeder link signal by receiving the amplification signal in a digital channelizer; and outputting a control signal to the variable-power attenuation unit depending on a use status of a frequency band of the feeder link signal, and then adjusting an attenuation of the variable-power attenuation unit, in a signal control unit.

[Supplementary Note 15]

The low-noise amplification method according to Supplementary note 14, wherein at an initial stage, an attenuation of the variable-power attenuation unit is set at 0, and the variable-power attenuation unit generates the reception signal as the attenuation signal without change.

[Supplementary Note 16]

The low-noise amplification method according to Supplementary note 14 or 15, wherein adjusting an attenuation of the variable-power adjustment unit in the signal control unit comprises generating a use status signal by monitoring a use status of a frequency band of the feeder link signal in a feeder link signal monitoring unit, setting and outputting a threshold of the use status signal in a threshold setting unit, outputting a comparison result by comparing the use status signal with the threshold in a comparison unit, and generating the control signal, based on the comparison result in a control signal generating unit.

[Supplementary Note 17]

An attenuation adjustment program causing a computer to adjust an attenuation of a variable-power attenuation unit for use in a low-noise amplification device provided in a communication satellite, the low-noise amplification device comprising: the variable-power attenuation unit which generates an attenuation signal by attenuating a reception signal received in the communication satellite; and a low-noise amplification unit which generates an amplification signal by amplifying the attenuation signal with low noise, the attenuation adjustment program causing the computer to perform processing of outputting a control signal to the variable-power attenuation unit depending on the attenuation signal, and then adjusting an attenuation of the variable-power attenuation unit.

[Supplementary Note 18]

The attenuation adjustment program according to Supplementary note 17, further causing the computer to perform processing of, at an initial stage, outputting a signal to set an attenuation of the variable-power attenuation unit at 0 as the control signal, and then causing the variable-power attenuation unit to generate the reception signal as the attenuation signal without change.

[Supplementary Note 19]

The attenuation adjustment program according to Supplementary note 17 or 18, further causing the computer to perform processing of generating a strength signal by monitoring strength of the attenuation signal, processing of setting and outputting a threshold of the strength signal, processing of outputting a comparison result by comparing the strength signal with the threshold, and processing of generating the control signal, based on the comparison result.

[Supplementary Note 20]

An attenuation adjustment program causing a computer to adjust an attenuation of a variable-power attenuation unit for use in a low-noise amplification device provided in a communication satellite, the low-noise amplification device comprising: the variable-power attenuation unit which generates an attenuation signal by attenuating a reception signal received in the communication satellite; and a low-noise amplification unit which generates an amplification signal by amplifying the attenuation signal with low noise, the attenuation adjustment program causing the computer to perform processing of outputting a control signal to the variable-power attenuation unit depending on the reception signal, and then adjusting an attenuation of the variable-power attenuation unit.

[Supplementary Note 21]

The attenuation adjustment program according to Supplementary note 20, further causing the computer to perform processing of generating a strength signal by monitoring strength of the reception signal, processing of setting and outputting a threshold of the strength signal, processing of outputting a difference signal by obtaining a difference between the strength signal and the threshold, and processing of generating the control signal, based on the difference signal.

[Supplementary Note 22]

An attenuation adjustment program causing a computer to adjust an attenuation of a variable-power attenuation unit for use in a low-noise amplification device provided in a communication satellite, the low-noise amplification device comprising: the variable-power attenuation unit which generates an attenuation signal by attenuating a reception signal received in the communication satellite; a low-noise amplification unit which generates an amplification signal by amplifying the attenuation signal with low noise; and a digital channelizer which generates a feeder link signal by receiving the amplification signal, the attenuation adjustment program causing the computer to perform processing of outputting a control signal to the variable-power attenuation unit depending on a use status of a frequency band of the feeder link signal, and then adjusting an attenuation of the variable-power attenuation unit.

[Supplementary Note 23]

The attenuation adjustment program according to Supplementary note 22, further causing the computer to perform processing of, at an initial stage, outputting a signal to set an attenuation of the variable-power attenuation unit at 0 as the control signal, and then causing the variable-power attenuation unit to generate the reception signal as the attenuation signal without change.

[Supplementary Note 24]

The attenuation adjustment program according to Supplementary note 22 or 23, further causing the computer to perform processing of generating a use status signal by monitoring a use status of a frequency band of the feeder link signal in a feeder link signal monitoring unit, processing of setting and outputting a threshold of the use status signal, processing of outputting a comparison result by comparing the use status signal with the threshold, and processing of generating the control signal, based on the comparison result.

This application is based upon and claims the benefit of priority from Japanese patent application No. 2015-120195, filed on Jun. 15, 2015, the disclosure of which is incorporated herein in its entirety by reference.

REFERENCE SIGNS LIST 10, 10A, 10B Low-noise amplification device
11 Antenna
12 Low-noise amplification unit
13 Variable-power attenuation unit
14, 14A, 14B Signal control unit
15 Antenna branching filter
16 Digital channelizer
17 Receiving circuit
20 First signal
21 First frequency band
30 Second signal
31 Second frequency band
40 Third signal
41 Third frequency band
50 Fourth signal
51 Fourth frequency band
60 Feeder link signal
61 Fifth frequency band
142, 142A, 142B Monitoring unit
144, 144A, 144B Threshold setting unit
146, 146B Comparison unit
146A Subtraction unit
148, 148A, 148B Control signal generating unit

What is claimed is:

1. A low-noise amplification device provided in a communication satellite, comprising:
    a variable-power attenuation unit which generates an attenuation signal by attenuating a reception signal received in the communication satellite;
    a low-noise amplification unit which generates an amplification signal by amplifying the attenuation signal with low noise; and
    a signal control unit which outputs a control signal to the variable-power attenuation unit depending on a use status of a frequency band of the reception signals, and then adjusts an attenuation of the variable-power attenuation unit.

2. The low-noise amplification device according to claim 1, wherein at an initial stage, an attenuation of the variable-power attenuation unit is set at 0, and the variable-power attenuation unit generates the reception signal as the attenuation signal without change.

3. The low-noise amplification device according to claim 1, wherein the signal control unit comprises
    a monitoring unit which generates a use status signal by monitoring the reception signals,
    a threshold setting unit which sets and outputs a threshold of the use status signal,
    a comparison unit which outputs a comparison result by comparing the strength signal with the threshold, and
    a control signal generating unit which generates the control signal, based on the comparison result.

4. The low-noise amplification device according to claim 1, further comprising:

a digital channelizer which generates a feeder link signal by receiving the amplification signal, wherein the signal control unit outputs the control signal to the variable-power attenuation unit depending on the use status of the frequency band of the feeder link signal, and then adjusts an attenuation of the variable-power attenuation unit.

5. A low-noise amplification method which is executed in a communication satellite, the method comprising:

generating an attenuation signal by attenuating, in a variable-power attenuation unit, a reception signal received in the communication satellite;

generating an amplification signal by amplifying the attenuation signal with low noise in a low-noise amplification unit; and outputting a control signal to the variable-power attenuation unit depending on a use status of a frequency band of the reception signals, and then adjusting an attenuation of the variable-power attenuation unit, in a signal control unit.

6. The low-noise amplification method according to claim 5, wherein at an initial stage, an attenuation of the variable-power attenuation unit is set at 0, and the variable-power attenuation unit generates the reception signal as the attenuation signal without change.

7. The low-noise amplification method according to claim 5, wherein adjusting an attenuation of the variable-power attenuation unit in the signal control unit comprises generating a use status signal by monitoring the use status of the frequency bad of the reception signals, setting and outputting a threshold of the use status signal in a threshold setting unit, outputting a comparison result by comparing the strength signal with the threshold in a comparison unit, and generating the control signal, based on the comparison result in a control signal generating unit.

8. A non-transitory computer readable medium storing a program causing a computer to adjust an attenuation of a variable-power attenuation unit for use in a low-noise amplification device provided in a communication satellite, the low-noise amplification device comprising: the variable-power attenuation unit which generates an attenuation signal by attenuating a reception signal received in the communication satellite; and a low-noise amplification unit which generates an amplification signal by amplifying the attenuation signal with low noise, the attenuation adjustment program causing the computer to perform processing of outputting a control signal to the variable-power attenuation unit depending on a use status of a frequency bad of the reception signals, and then adjusting an attenuation of the variable-power attenuation unit.

9. The non-transitory computer readable medium according to claim 8, wherein the program further causes the computer to perform processing of, at an initial stage, outputs a signal to set an attenuation of the variable-power attenuation unit at 0 as the control signal, and then causes the variable-power attenuation unit to generate the reception signal as the attenuation signal without change.

10. The low-noise amplification device according to claim 4, wherein the signal control unit comprises a monitoring unit which generates a use status signal by monitoring a use status of a frequency band of the feeder link signal, a threshold setting unit which sets and outputs a threshold of the use status signal, a comparison unit which outputs a comparison result by comparing the use status signal with the threshold, and a control signal generating unit which generates the control signal, based on the comparison result.

11. The low-noise amplification method according to claim 5, wherein generating a feeder link signal by receiving the amplification signal, outputting the control signal to the variable-power attenuation unit depending on the use status of the frequency band of the feeder link signal, and adjusting an attenuation of the variable-power attenuation unit.

12. The non-transitory computer readable medium according to claim 8, wherein the program further causing the computer to perform processing of outputting a control signal to the variable-power attenuation unit depending on the use status of the frequency band of a feeder link signal, and adjusting an attenuation of the variable-power attenuation unit.

* * * * *